(12) United States Patent
Li et al.

(10) Patent No.: US 7,981,591 B2
(45) Date of Patent: Jul. 19, 2011

(54) SEMICONDUCTOR BURIED GRATING FABRICATION METHOD

(75) Inventors: Yabo Li, Action, MA (US); Kechang Song, Painted Post, NY (US); Nicholas John Visovsky, Corning, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 718 days.

(21) Appl. No.: 12/079,524

(22) Filed: Mar. 27, 2008

(65) Prior Publication Data

US 2009/0246707 A1  Oct. 1, 2009

(51) Int. Cl.
G03F 7/26  (2006.01)
(52) U.S. Cl. .......................... 430/314; 430/316
(58) Field of Classification Search .................. 430/314, 430/316, 1, 313, 320, 321, 319
See application file for complete search history.

(56) References Cited

U.S. PATENT DOCUMENTS

| | | | |
|---|---|---|---|
| 5,567,659 A | 10/1996 | Pakulski et al. | 437/228 |
| 5,982,804 A | 11/1999 | Chen et al. | 372/96 |
| 6,304,587 B1 | 10/2001 | Zah | |
| 6,551,936 B2 | 4/2003 | Pakulski et al. | 438/694 |
| 6,878,959 B2* | 4/2005 | Bour et al. | 257/14 |
| 2002/0139775 A1* | 10/2002 | Chang et al. | 216/67 |
| 2005/0117169 A1* | 6/2005 | Weitzel | 356/521 |
| 2005/0189315 A1 | 9/2005 | Knight et al. | |
| 2005/0277063 A1 | 12/2005 | Wang et al. | |

FOREIGN PATENT DOCUMENTS

WO  WO2005/043701 A1  5/2005

OTHER PUBLICATIONS

George R. Harrison, "The Production of Diffraction Gratings I. Development of the Ruling Art" J. Opt. Soc. Am., 39(6):413-426 (1949).

K.C. Song, Y. Li, N. Visovsky, M. Hu, H. K. Nguyen, X.S. Liu, S. Coleman, B. Paddock, M. Turner, C. Catherine, R. Bhat C.E. Zah, "High Power 1060 NM DBR Lasers With Quantum Well Intermixed Passive Sections", submitted to IEEE LEOS 18th Annual Meeting (2005).

(Continued)

Primary Examiner — Kathleen Duda
Assistant Examiner — Caleen O Sullivan
(74) Attorney, Agent, or Firm — Kwadjo Adusei-Poku

(57) ABSTRACT

Methods for forming grating profiles in semiconductor laser structures comprise the steps of providing a semiconductor wafer comprising a wafer substrate, an etch stop layer disposed over the wafer substrate, a grating layer disposed over the etch stop layer, an etch mask layer disposed over the grating layer, and a photoresist layer disposed over the etch mask layer, forming a photoresist grating pattern, transferring the photoresist grating pattern into the grating layers via dry etching, and removing the photoresist layer, selectively wet etching the grating layer to form the grating profile in the grating layer. The placement of the grating layer between the etch mask and etch stop layers controls the selective wet etching step. The method also comprises removing the etch mask layer via selective wet etching without altering the grating profile, and regrowing an upper cladding layer to produce the semiconductor laser structure.

24 Claims, 5 Drawing Sheets

OTHER PUBLICATIONS

Hyeon Soo Kim, Fun-Hwa Lee, et al Reliable and Damage-Free Dry Grating Etch for the Ingaasp DFB Laser Diodes, ThP23, Indium Phosphide and Related Materials, 2003. International Conference.

Otte Jakob Homam, "A GAAS/ALGAAS DBR Laser Diode With Side-Coupled Bragg Gratings", Dissertation of Doctor of Technical Science, 1996.

Skogen, E.J.; "Quantum well intermixing for wavelength-agile photonic integrated circuits"; PhD Dissertation—Electrical and Computer Engineering Department, University of California Santa Barbara, Jun. 2003.

Song, K. et al.; "High power 1060 nm DBR lasers with quantum well intermixed passive sections"; Lasers and Electro-Optics Society, 2005.

Zah, C. et al.; "High power 1060-nm raised-ridge strained single-quantum-well lasers"; Semiconductor Laser Conference, 2004.

Wiedmann, J. et al.; "GaInAsP/InP distributed reflector lasers consisting of deeply etched vertical gratings"; Japanese Journal of Applied Physics Part 1, vol. 40, No. 12, p. 6845-6851, 2001.

* cited by examiner

US 7,981,591 B2

SEMICONDUCTOR BURIED GRATING FABRICATION METHOD

BACKGROUND

This invention is related to the field of semiconductor lasers and in particular to a method for fabricating gratings in semiconductor materials for DBR or DFB lasers.

SUMMARY

In semiconductor related fields, gratings are patterns made of periodic lines and spaces. Typical examples of gratings are periodic corrugations with defined pitch on a semiconductor surface. Attributed to its periodical structure interplaying with electromagnetic radiation, gratings manifest many interesting and useful characteristics, such as spectrum meter, wavelength filter, and wavelength selective reflector. Consequently, applying gratings has been increasingly used in structures such as semiconductor optoelectronic devices. Examples of these structures include distributed feedback Bragg (DFB) and distributed Bragg reflector (DBR) lasers, where a diffraction grating is formed on a region along an active layer or is formed behind or/and before the active region. This enables selection and stabilization of an oscillating frequency, or selective reflection of an oscillation frequency to produce single wavelength optical radiation. In modern communication systems, the DFB lasers are used in dense wavelength division multiplexing applications where accurate and stable optical signals are required. The DBR lasers, due to their narrow line width and tunable wavelength, have increasingly been applied in the area of medical sensors and displays, etc. Consequently, embodiments of the present invention are generally directed to the fabrication of semiconductor gratings and are specifically directed to semiconductor buried gratings.

According to one embodiment of the present invention, a method of forming a grating profile in a semiconductor laser structure is provided. The method comprises providing a semiconductor wafer comprising a wafer substrate with appropriate quantum well laser structure, (hereafter cited as wafer substrate), an etch stop layer disposed over the wafer substrate, a grating layer disposed over the etch stop layer, an etch mask layer disposed over the grating layer, and a photoresist layer disposed over the etch mask layer. The method also comprises the steps of forming a photoresist grating pattern in the photoresist layer, transferring the photoresist grating pattern into the etch mask layer, and then transferring the grating pattern to the grating layer via dry etching, removing the photoresist layer, and selectively wet etching the grating layer to form the grating profile in the grating layer. The placement of the grating layer between the etch mask layer and the etch stop layer controls the selective wet etching and thereby the grating profile. The method further comprises removing the etch mask layer without altering the grating profile of the grating layer through selective wet etching, and regrowing an upper cladding layer over the grating layer to produce a DBR section in the semiconductor laser structure.

In further embodiments, the method may include the steps of forming the photoresist grating pattern in the photoresist layer through a holography system and conducting a descum procedure on the photoresist layer to produce a descumed photoresist grating pattern.

These and additional features provided by the embodiments of the present invention will be more fully understood in view of the following detailed description, in conjunction with the drawings.

BRIEF DESCRIPTION OF THE DRAWINGS

The following detailed description of specific embodiments of the present invention can be best understood when read in conjunction with the drawings enclosed herewith. The drawing sheets include.

Figure 1A:
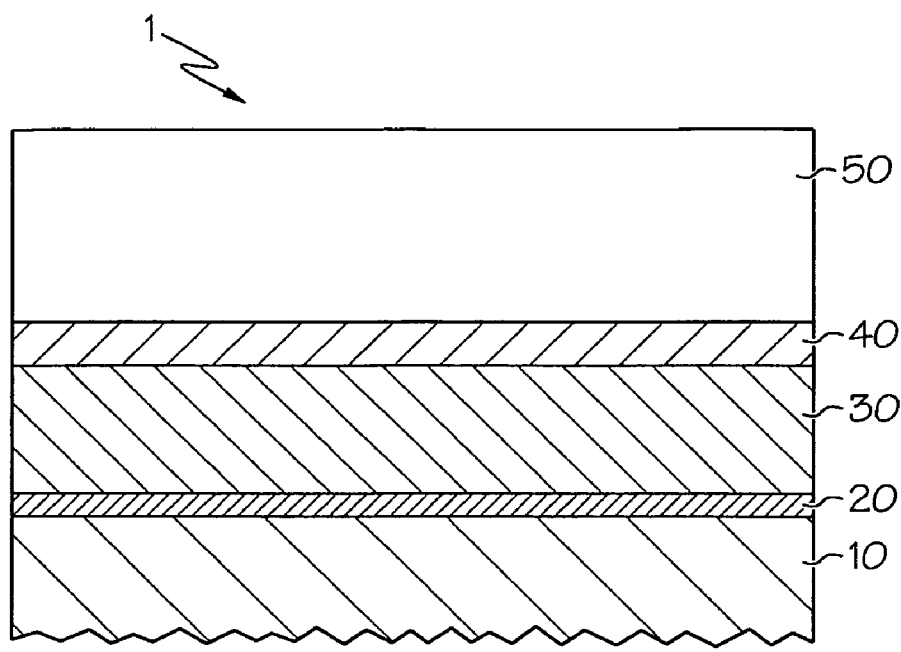
FIG. 1A is a cross-sectional schematic view of a semiconductor wafer comprising a wafer substrate, an etch stop layer over the wafer substrate, a grating layer over the etch stop layer, an etch mask layer over the grating layer, and a photoresist layer over the etch mask layer according to one or more embodiments of the present invention.

The embodiments set forth in the drawings are illustrative in nature and not intended to be limiting of the invention defined by the claims. Moreover, individual features of the drawings and the invention will be more fully apparent and understood in view of the detailed description.

DETAILED DESCRIPTION

Embodiments of the present invention are directed to methods of fabricating grating profiles for semiconductors lasers, for example, distributed Bragg reflector (DBR) lasers which may produce a power output of 700 mW at a 1060 nm wavelength with a single frequency and single lateral mode. As used herein, the "profile" refers to the grating pattern in the grating layer of the semiconductor device. To produce these increased laser properties, the methods of the present invention are centered on producing a high quality grating profile and thereby an improved laser spectral performance. The quality of the grating profile is improved by optimizing the pitch size, duty cycle, grating line height, uniformity, and crystalline properties of grating regrown interface region.

In one embodiment, the present method employs a hybrid-etching process including dry etching (e.g., reactive ion etching (RIE)) and chemical wet etching. The process initiates with RIE, which has finer controllability, and finishes with one or more wet etch steps that remove the RIE-damaged surface layer to achieve a crystal surface substantially free of contaminants. This facilitates the cladding layer regrowth and avoids the potential degradation of device reliability.

To produce the grating profile, a semiconductor wafer 1 as shown is prepared. The semiconductor wafer comprises a wafer substrate 10, an etch stop layer 20 disposed over the wafer substrate 10, a grating layer 30 disposed over the etch stop layer 20, an etch mask layer 40 disposed over the grating layer 30, and a photoresist layer 50 disposed over the etch mask layer 40. AS used herein, "over" means that one layer is applied on, but not necessarily directly on another layer. In the present invention, the addition of intervening layers is contemplated herein. Furthermore, the term "over" does not require that the layer cover the entire surface, any may only include partial coverage. The above layers may be grown or produced onto the wafer substrate through various methods familiar to one of ordinary skill in the art. For example, the semiconductor wafer 1 may be grown via low pressure Organometallic Vapor Phase Epitaxy (MOVPE).

Various compositions are contemplated for the semiconductor wafer 1. In one embodiment, the wafer substrate 10, which comprises an active lasing region, is a graded index separate confinement heterostructure (GRINSCH). The etch stop layer 20, the grating layer 30, and the etch mask layer 40 may all comprise aluminum free materials with a bandgap wavelength shorter than 1000 nm. In one embodiment, the etch stop layer 20 may comprise an InGaAsP composition with a thickness of thicker than 5 nm. In an exemplary embodiment, the etch stop layer may comprise a thickness of about 50 nm. The grating layer 30 may comprise GaAs, GaInP, other group III-V semiconductor compositions, or combinations thereof, and the etch mask 40 layer may comprise GaAs, GaInP, other group III-V semiconductor compositions, or combinations thereof. In further embodiments, the grating layer 30 may comprise GaAs when the etch mask layer 40 comprises GaInP, or the grating layer 30 may comprise GaInP when the etch mask layer 40 comprises GaAs.

Regarding layer size, the grating layer 30 may comprise a thickness of about 5 to about 500 nm (e.g., 100 nm), whereas the etch mask layer 40 comprise a thickness of greater than 5 nm (e.g., 50 nm). Additionally, the etch stop layer 20 may comprise a bandgap wavelength close to that of the upper cladding layer.

The etch mask layer 40 compositions yield improvements over conventional methods. Conventional methods, which utilize hard etch mask compositions such as silicon nitride or oxide, lead to contamination of the grating layers or other components of the semiconductor structures. The present compositions of the etch mask layer 40 greatly diminish the contamination that results from conventional methods. The etch stop layer 20 facilitates control of the depth and the duty cycle of the grating profile, which are essential to maximize grating reflection efficiency.

Referring again to FIG. 1A, the photoresist layer 50 may comprise any suitable photoresist composition familiar to one of ordinary skill in the art (e.g., positive or negative photoresist). In one embodiment, the photoresist is a positive photoresist comprising a thickness of about 25 to about 500 nm. In an exemplary embodiment, the positive photoresist may comprise a thickness of about 100 nm. One example of a suitable positive photoresist material is the SPR3012 positive photoresist material manufactured by MicroChem Corp. Suitable negative photoresists may also be used.

After the above described layers are disposed on the wafer substrate 1, the semiconductor wafer 1 may undergo additional processing steps prior to forming the grating profile. For example, the semiconductor wafer 1 may undergo a quantum well intermixing step.

Figure 1B:
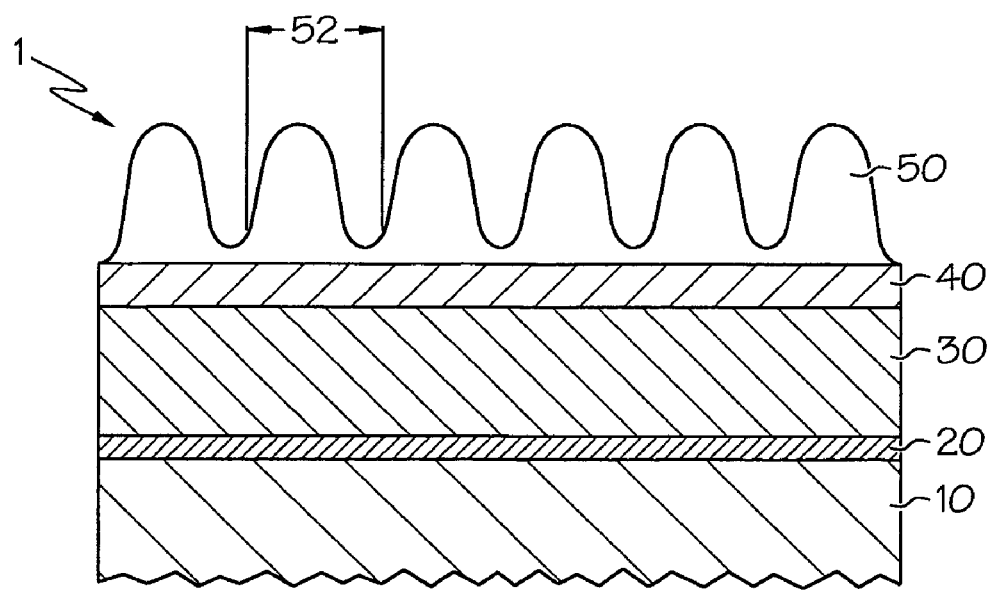
FIG. 1B is a cross-sectional schematic view illustrating the photoresist grating pattern produced in the photoresist layer of FIG. 1A by a holography system according to one or more embodiments of the present invention.
Figure 2:
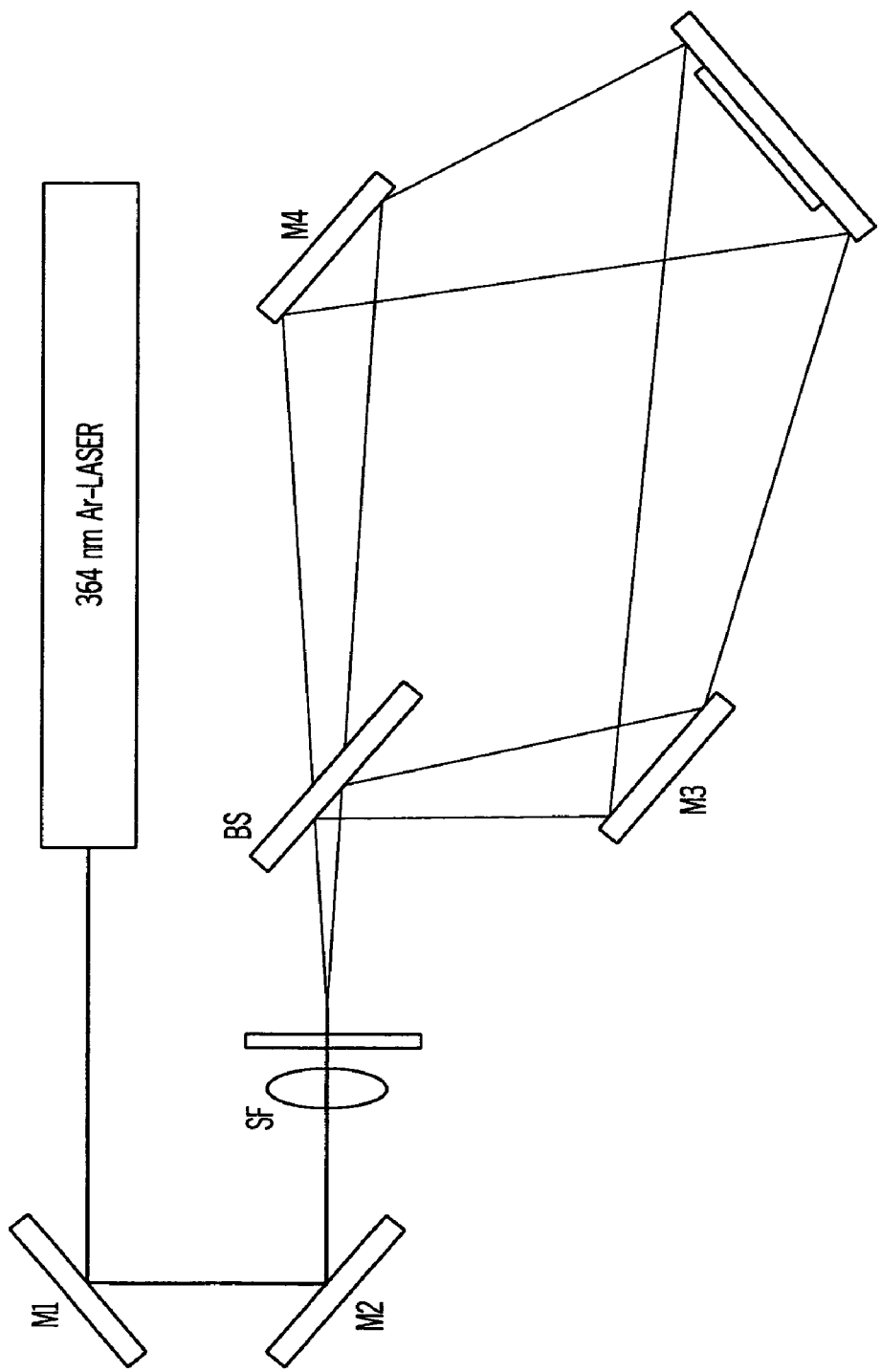
FIG. 2 is a schematic view of a two beam laser holography system according to one or more embodiments of the present invention.

Referring to FIG. 1B, a photoresist grating pattern is formed in the photoresist layer 50 though a holography system. Referring to FIG. 2, a two beam laser interference holography system may be utilized. The two beam laser holography system forms interference fringes in the photoresist layer at the wafer surface to form grating pattern (e.g. a second order grating pattern). In the exemplary embodiment of FIG. 2, the two beam laser interference holography system consists of a coherent argon-ion laser source tuned to emit about 150 mW UV light at 361 nm. This laser beam is redirected onto an optical table by mirrors M1 and M2. Then the beam is expanded and purified by a spatial filter (SF), which consists of a microscope object lens and a pinhole to remove the higher-order diffracted modes resulting from component imperfections. The expanded beam is then divided into two beams by a beam splitter (BS). The split beams are reflected by two mirrors M3, M4 and projected to the substrate surface to form interference fringes over photoresist layer 50 on the substrate surface. The grating exposure can also be done using a single expanded laser beam with a corner reflector. This is referred to as the Lloyd/corner cube method.

Because of the inherent behavior of holography interference fringes, the holography system produces a grating pattern with more or less a sinusoidal profile in the photoresist layer 50. The actual shape of the photoresist grating lines depends on the contrast of the interference fringes, on the exposure time, as well as on the development time after exposure. As a result, the trench bottom of the photoresist 50 is, in most cases, only partially opened as shown in FIG. 1B. After holography the grating pattern may comprise a pitch 52 of about 317 nm. This pitch value 52 may be transferred via the present process to the grating profile of the grating layer 30 as shown in FIG. 1H. Although this discussion centers on holography, other suitable methods are contemplated herein.

Figure 1C:
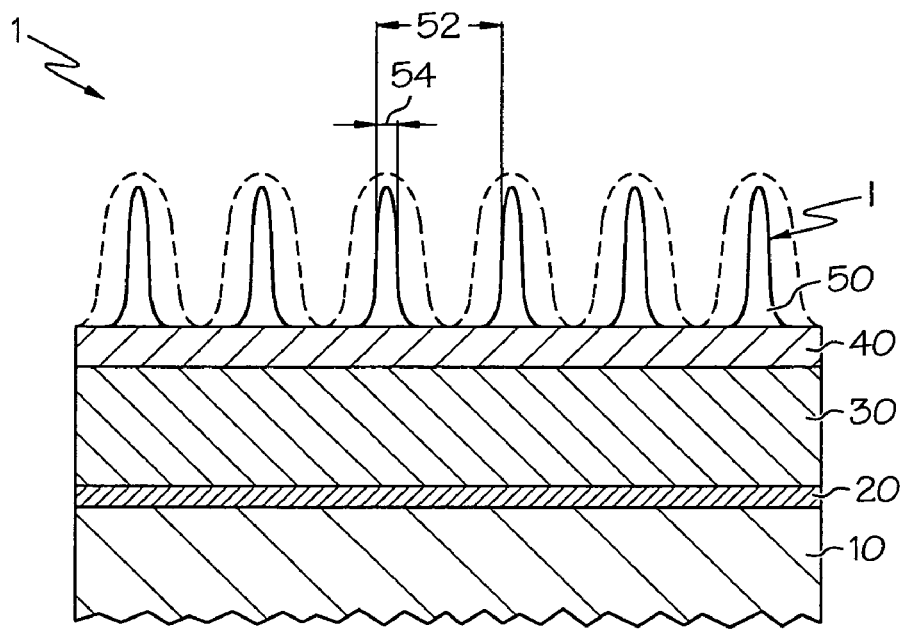
FIG. 1C is a cross-sectional schematic view illustrating the descumed photoresist grating pattern produced by descuming the photoresist grating pattern of FIG. 1B according to one or more embodiments of the present invention.

Referring to FIG. 1C, the semiconductor wafer 1 may undergo a descum procedure to remove a further portion of the photoresist layer 50. The descuming procedure, which may utilize any suitable descum agent (e.g. oxygen containing plasma), cleans the photoresist layer 50 at the trench bottom while optimizing the grating line thickness and duty cycle of the photoresist grating pattern. In one exemplary embodiment, the descumed photoresist grating pattern may define a duty cycle 54 of about 0.25 to about 0.3, or about 0.75 to about 0.8. Because the desired duty cycle 54 of a photoresist grating pattern may differ due to holography variations, the descum time may be adjusted as necessary to obtain the desired duty cycle. As shown in FIG. 1H, this duty cycle 54 may be transferred via the present process to the grating profile of the grating layer 30. Although the descum procedure is highly effective at controlling and achieving the desired duty cycle, it is contemplated that the present method may achieve the desired duty cycle without this descum step.

Figure 1D:
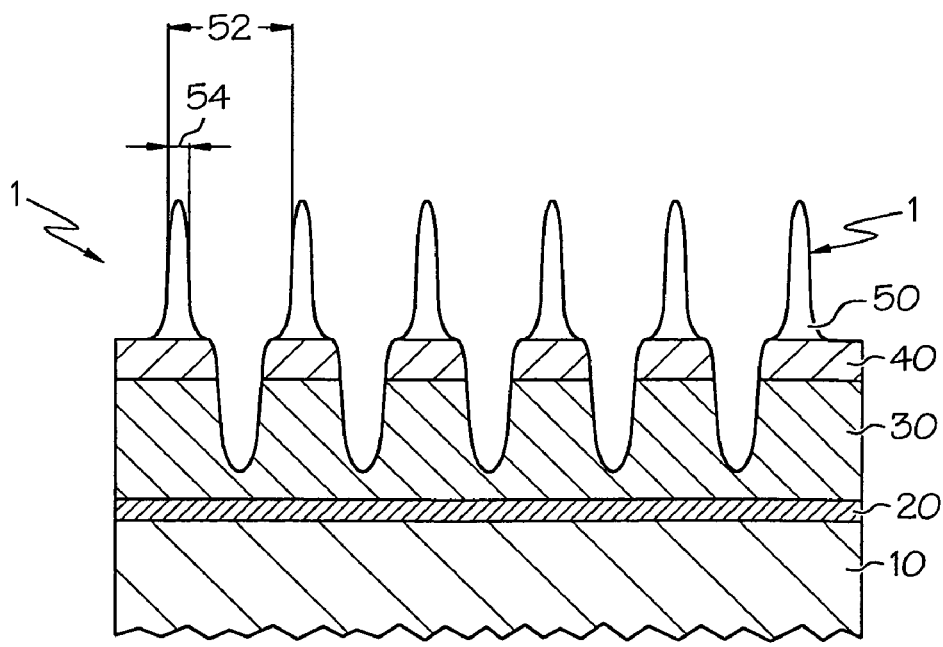
FIG. 1D is a cross-sectional schematic view illustrating the transfer of the descumed photoresist grating pattern of FIG. 1C through the etch mask and into the grating layer using reactive ion etching (RIE) according to one or more embodiments of the present invention.

Next, as shown in FIG. 1D, the semiconductor wafer 1 may undergo a dry etching procedure to transfer the descumed photoresist grating pattern into the etch mask layer 40 and the grating layer 30. In one embodiment, the dry etch process is a reactive ion etching (RIE) process. The RIE process may utilize a carbon hydrogen based reactive ion etchant (e.g., a methane and hydrogen gas mixture). In one exemplary embodiment, the RIE process is carried out in an inductance coupled plasma (ICP) etcher, wherein the etchant punches through the 50 nm GaInP etch mask layer 40 and travels about 75-80 nm deep into the 100 nm GaAs grating layer 30. Because of its non-selectivity, the RIE may be controlled to avoid etching through the GaInAsP etch stop layer 20. Otherwise, defects may be created during the regrowth step illustrated in FIG. 1H.

During this dry etch step and throughout the entire procedure, the grating profile may be monitored through analysis using an atomic force microscope (AFM), which may measure the grating line width, the duty cycle, and the line height. The present fabrication method may control the grating parameters by monitoring every process step using an atomic force microscope (AFM). Based on the resultant data of each step, the process parameters may be adjusted to achieve the desired grating duty cycle, line width and height, and thereby achieve a final optimized grating profile.

Figure 1E:
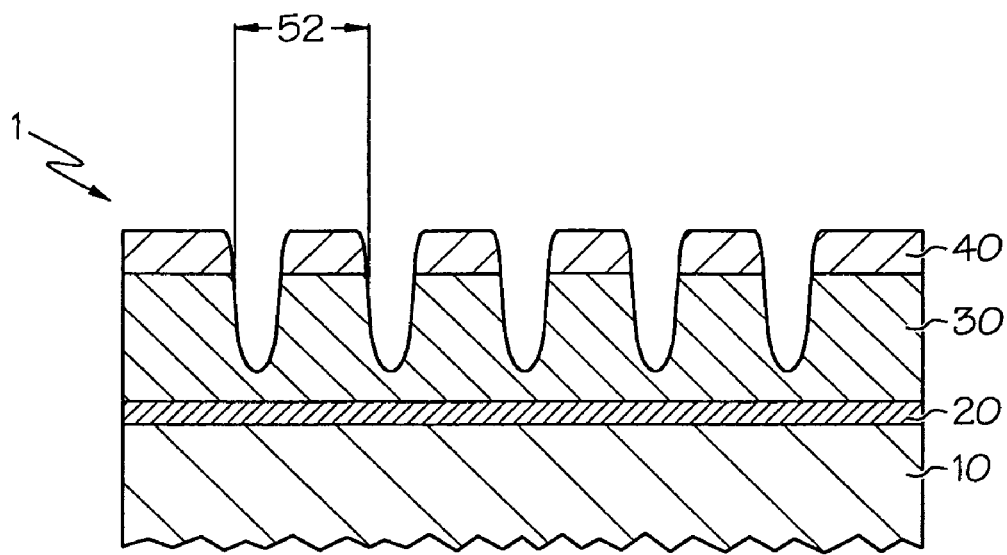
FIG. 1E is a cross-sectional schematic view illustrating the post-removal of the photoresist layer of FIG. 1D according to one or more embodiments of the present invention.

After the dry etch step, the photoresist layer 50 may be removed as shown in FIG. 1E. Various photoresist layer removal processes, as would be familiar to one of ordinary skill in the art, may be utilized. In one embodiment, the photoresist layer 50 is removed via etching with oxygen plasma.

Figure 1F:
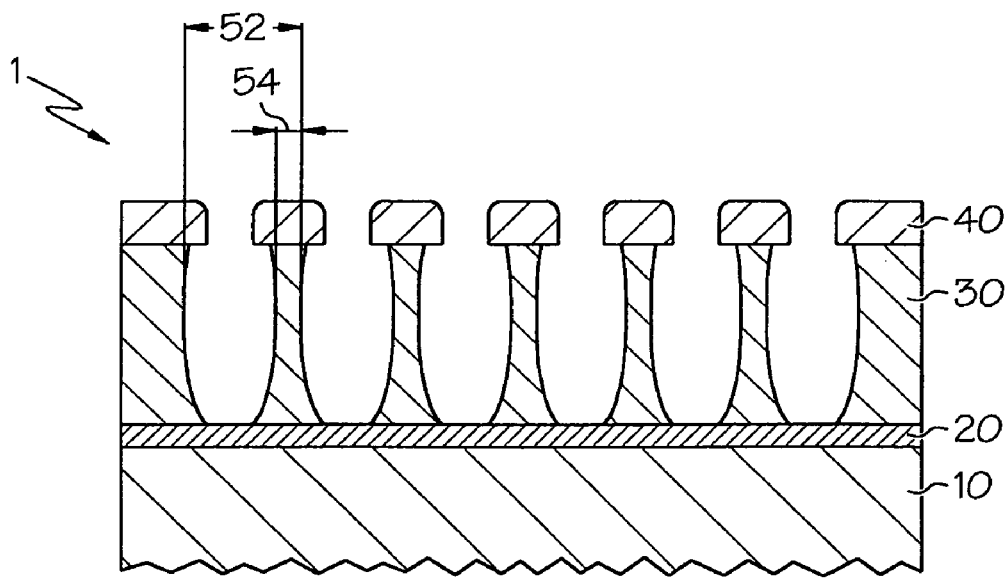
FIG. 1F is a cross-sectional schematic view illustrating the selective chemical wet etching of the grating layer of FIG. 1E according to one or more embodiments of the present invention.

Referring to FIG. 1F, the grating layer 30 is then selectively wet etched using a chemical composition to form the grating profile in the grating layer 30. As shown in FIG. 1F, the placement of the grating layer 30 between the etch mask layer 40 and the etch stop layer 20 controls the wet etching of the grating layer 30. In one exemplary embodiment, a selective chemical etchant comprising sulfuric acid and hydrogen peroxide etches a GaAs grating layer 30 without etching the GaInP mask layer 40. Due to this selectivity, the etch mask 40 ensures the etchant deepens the trench of the grating layer 30. Moreover as shown in FIG. 1F, this selective etching of the GaAs grating layer 30 also utilizes the InGaAsP etch stop layer 20 to control the duty cycle 54, because the wet etching process terminates at the surface of the InGaAsP etch stop layer 20. By utilizing this stop layer 20, the duty cycle 54 of the grating profile can be optimized by controlling the wet etch time without changing the grating depth which is predefined by the thickness of the GaAs grating layer 30. As stated above, the grating duty cycle 54 is a primary parameter determining the reflection efficiency of a grating. Although the discussion centers on a GaAs grating layer 30, other grating layer 30 compositions (e.g., GaInP) and other selective etchants are also contemplated herein.

Figure 1G:
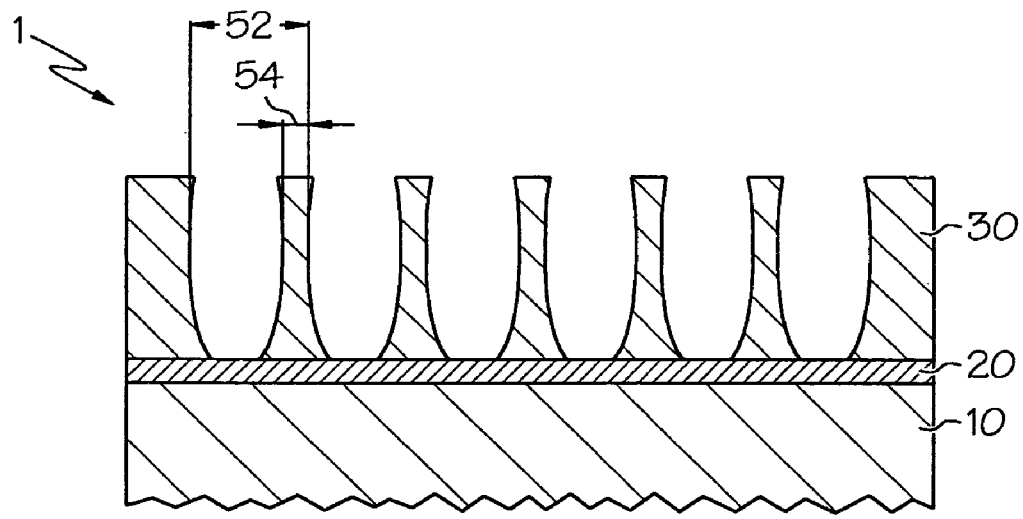
FIG. 1G is a cross-sectional schematic view illustrating the removal of the etch mask layer of FIG. 1F via selective chemical wet etching according to one or more embodiments of the present invention.
Figure 1H:
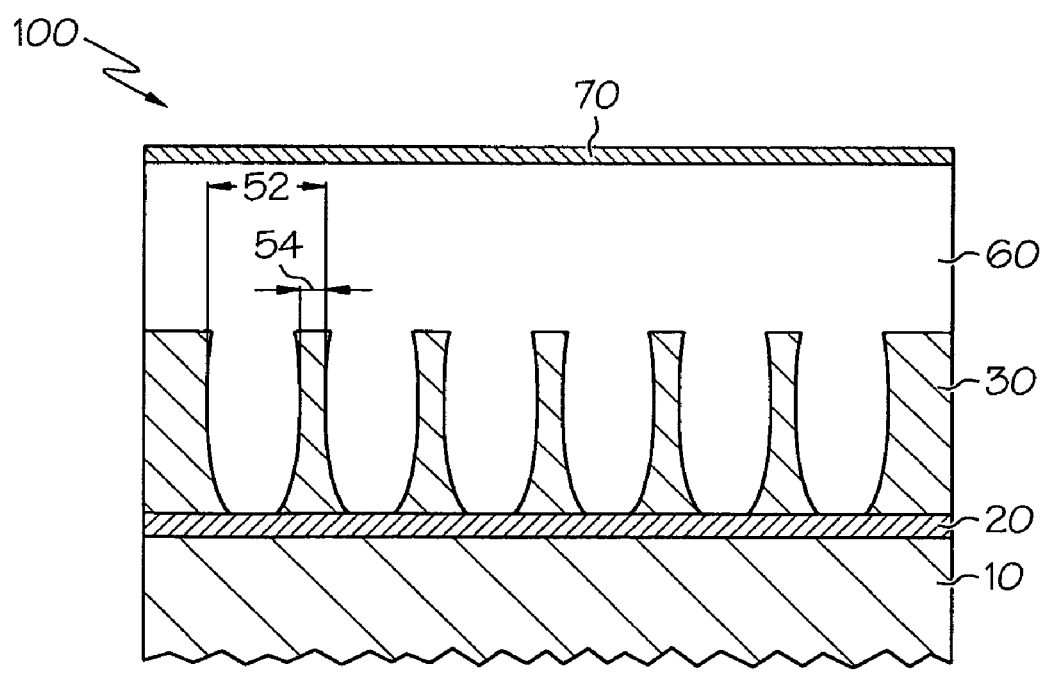
FIG. 1H is a cross-sectional schematic view illustrating the re-growth of the cladding layer over the grating layer of FIG. 1G to form a semiconductor laser structure according to one or more embodiments of the present invention.

As shown in FIG. 1G, the etch mask layer 40 is removed by an additional selective wet etching step. Under this step, the etch mask layer 40 is removed without altering the grating profile of the grating layer 30. In an exemplary embodiment, a selective etch solution comprising phosphoric and hydrochloride acid solution is used to etch a GaInP etch mask layer 40, while leaving the GaAs grating layer 30 and etch stop layer 20 unaffected. Other compositions for the etch mask layer 40, the grating layer 30, the etch stop layer 20, and the selective etchant are contemplated herein.

After the mask layer is removed, an upper cladding layer 60 is grown over the grating layer 30 to bury the grating profile and produce the semiconductor laser structure 100 as shown in FIG. 1H. The upper cladding layer 60 may comprise AlGaAs or another suitable composition. The semiconductor laser structure 100 may further comprise a contact layer 70 comprising GaAs disposed over the upper cladding layer 60. After regrowth, the semiconductor structure 100 may undergo further processing to form a raised ridge waveguide DBR laser.

Optionally, the present fabrication process may utilize additional processing steps prior to regrowth. In one embodiment, the wafer 1, as shown in FIG. 1G, may be etched to remove any shallow crystal damage and Si contamination at the surface. The etching step is typically conducted using a chemical wet etch. Suitable chemicals may include, but are not limited to, HF, or the chemical etchants described above. To further ensure contaminants are removed, additional processing procedures such as a UV/Ozone treatment may be utilized.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method of forming a grating profile in a semiconductor laser structure comprising:

providing a semiconductor wafer comprising a wafer substrate, an etch stop layer disposed over the wafer substrate, a grating layer disposed over the etch stop layer, an etch mask layer disposed over the grating layer, and a photoresist layer disposed over the etch mask layer, wherein the wafer substrate comprises an active lasing region;

forming a photoresist grating pattern in the photoresist layer;

transferring the photoresist grating pattern into the grating layer via dry etching;

removing the photoresist layer;

performing a first selective wet etching on the grating layer to form the grating profile in the grating layer, wherein the placement of the grating layer between the etch mask layer and the etch stop layer controls the first selective wet etching;

performing a second selective wet etching after the first selective wet etching to remove the etch mask layer without altering the grating profile of the grating layer; and regrowing an upper cladding layer over the grating layer to produce the semiconductor laser structure.

2. The method of claim 1 wherein the wafer substrate is a graded index separate confinement heterostructure (GRIN-SCH).

3. The method of claim 1 wherein the semiconductor wafer undergoes quantum well intermixing prior to forming the photoresist grating pattern in the photoresist layer.

4. The method of claim 1 wherein the etch stop layer comprises InGaAsP and defines a thickness of from about 5 nm to about 50 nm.

5. The method of claim 1 wherein the grating layer comprises GaAs, GaInP, other group III-V semiconductor compositions, or combinations thereof, and defines a thickness of from about 5 to about 500 nm.

6. The method of claim 1 wherein the etch mask layer comprises GaAs, GaInP, group III-V semiconductor compositions, or combinations thereof, and defines a thickness of greater than 5 nm.

7. The method of claim 1 wherein the photoresist layer comprises a positive photoresist or negative photoresist.

8. The method of claim 1 wherein the upper cladding layer comprises AlGaAs.

9. The method of claim 1 further comprising a contact layer comprising GaAs disposed over the upper cladding layer.

10. The method of claim 1 wherein the semiconductor laser structure is a distributed Bragg reflector (DBR) laser.

11. The method of claim 10 wherein the DBR laser is a raised ridge waveguide DBR laser, which produces a power output of 700 mW at a 1060 nm wavelength.

12. The method of claim 1 wherein the layers of the semiconductor wafer are grown onto the wafer substrate via low pressure Organometallic Vapor Phase Epitaxy (MOVPE).

13. The method of claim 1 wherein the photoresist grating pattern is formed through a holography system.

14. The method of claim 13 wherein the holography system is a two beam interference holography system.

15. The method of claim 1 further comprising performing a descum procedure on the photoresist layer to produce a descumed photoresist grating pattern prior to dry etching.

16. The method of claim 1 wherein the photoresist grating pattern is dry etched into the etch mask layer and the grating layer using reactive ion etching (RIE).

17. The method of claim 1 wherein the photoresist layer is removed via etching with oxygen plasma.

18. The method of claim 1 wherein the first selective wet etching and the second selective wet etching utilizes a solution of sulfuric acid and hydrogen peroxide, a solution of phosphoric acid and hydrochloride acid, or combinations thereof.

19. The method of claim 1 further comprising analyzing the grating profile using an atomic force microscope (AFM).

20. The method of claim 1 further comprising etching the semiconductor wafer prior to the regrowth step.

21. The method of claim 1 further comprising conducting a UV/Ozone treatment prior to the regrowth step.

22. A method of forming a grating profile in a semiconductor laser structure comprising:
providing a semiconductor wafer comprising a wafer substrate, an etch stop layer comprising GaAsInP disposed over the wafer substrate, a grating layer comprising GaAs disposed over the etch stop layer, an etch mask layer comprising GaInP disposed over the grating layer, and a photoresist layer disposed over the etch mask layer, wherein the wafer substrate comprises an active lasing region;
forming a photoresist grating pattern in the photoresist layer through a holography system;
conducting a descum procedure on the photoresist layer to produce a descumed photoresist grating pattern;
transferring the descumed photoresist grating pattern into the grating layer via dry etching;
removing the photoresist layer via etching;
performing a first selective wet etching on the grating layer to form the grating profile in the grating layer, wherein the placement of the grating layer between the etch mask layer and the etch stop layer controls the first selective wet etching;
performing a second selective wet etching after the first selective wet etching to remove the etch mask layer without altering the grating profile of the grating layer; and
regrowing an upper cladding layer over the grating layer to produce the semiconductor laser structure.

23. The method of claim 22 wherein the photoresist layer comprises a thickness in a range from about 25 nm to about 500 nm.

24. A method of forming a grating profile in a semiconductor laser structure comprising:
providing a semiconductor wafer comprising a wafer substrate, an etch stop layer disposed over the wafer substrate, a grating layer disposed over the etch stop layer, an etch mask layer disposed over the grating layer, and a photoresist layer comprising a thickness in a range from about 25 nm to about 500 nm disposed over the etch mask layer, wherein the wafer substrate comprises an active lasing region;
forming a photoresist grating pattern in the photoresist layer;
transferring the photoresist grating pattern into the grating layer via dry etching;
removing the photoresist layer;
selectively-wet etching the grating layer to form the grating profile in the grating layer, wherein the placement of the grating layer between the etch mask layer and the etch stop layer controls the first selective wet etching;
removing the etch mask layer without altering the grating profile of the grating layer through selective wet etching; and
regrowing an upper cladding layer over the grating layer to produce the semiconductor laser structure.

* * * * *